(12) United States Patent
Yu et al.

(10) Patent No.: US 8,729,631 B2
(45) Date of Patent: May 20, 2014

(54) MOS TRANSISTOR

(75) Inventors: Kun-Huang Yu, New Taipei (TW); Chin-Fu Chen, Taoyuan County (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 13/596,481

(22) Filed: Aug. 28, 2012

(65) Prior Publication Data

US 2014/0061791 A1    Mar. 6, 2014

(51) Int. Cl.
*H01L 29/66* (2006.01)
(52) U.S. Cl.
USPC .......................................................... 257/343
(58) Field of Classification Search
USPC ................... 257/341, 343, 345; 438/271
See application file for complete search history.

(56) References Cited

U.S. PATENT DOCUMENTS

| | | |
|---|---|---|
| 4,344,081 A | 8/1982 | Pao et al. |
| 4,396,999 A | 8/1983 | Malaviya |
| 4,893,160 A | 1/1990 | Blanchard |
| 4,918,333 A | 4/1990 | Anderson et al. |
| 4,958,089 A | 9/1990 | Fitzpatrick et al. |
| 5,040,045 A | 8/1991 | McArthur et al. |
| 5,268,589 A | 12/1993 | Dathe |
| 5,296,393 A | 3/1994 | Smayling et al. |
| 5,326,711 A | 7/1994 | Malhi |
| 5,346,835 A | 9/1994 | Malhi et al. |
| 5,430,316 A | 7/1995 | Contiero et al. |
| 5,436,486 A | 7/1995 | Fujishima et al. |
| 5,534,721 A | 7/1996 | Shibib |
| 5,811,850 A | 9/1998 | Smayling et al. |
| 5,950,090 A | 9/1999 | Chen et al. |
| 5,998,301 A | 12/1999 | Pham et al. |
| 6,066,884 A | 5/2000 | Krutsick |
| 6,144,538 A | 11/2000 | Chao |
| 6,165,846 A | 12/2000 | Carns et al. |
| 6,245,689 B1 | 6/2001 | Hao et al. |
| 6,277,675 B1 | 8/2001 | Tung |
| 6,277,757 B1 | 8/2001 | Lin |
| 6,297,108 B1 | 10/2001 | Chu |
| 6,306,700 B1 | 10/2001 | Yang |
| 6,326,283 B1 | 12/2001 | Liang et al. |
| 6,353,247 B1 | 3/2002 | Pan |
| 6,388,292 B1 | 5/2002 | Lin |
| 6,400,003 B1 | 6/2002 | Huang |
| 6,424,005 B1 | 7/2002 | Tsai et al. |
| 6,514,830 B1 | 2/2003 | Fang et al. |
| 6,521,538 B2 | 2/2003 | Soga et al. |
| 6,614,089 B2 | 9/2003 | Nakamura et al. |

(Continued)

OTHER PUBLICATIONS

Chiu-Te Lee et al., U.S. Appl. No. 13/454,149, filed Apr. 24, 2012, pp. 1-28.

*Primary Examiner* — Matthew W Such
*Assistant Examiner* — Warren H Kilpatrick
(74) *Attorney, Agent, or Firm* — J.C. Patents

(57) ABSTRACT

A MOS transistor is described, including: a source region and a drain region in a semiconductor substrate, an isolation between the source region and the drain region, a first gate conductor between the source region and the isolation, at least one conductive plug electrically connected to the first gate conductor and penetrating into the isolation, and at least one second gate conductor on the isolation, which is electrically connected to the first gate conductor and the at least one conductive plug. One of the at least one conductive plug is between the first gate conductor and the at least one second gate conductor.

18 Claims, 3 Drawing Sheets

(56) References Cited

U.S. PATENT DOCUMENTS

| | | |
|---|---|---|
| 6,713,794 B2 | 3/2004 | Suzuki |
| 6,762,098 B2 | 7/2004 | Hshieh et al. |
| 6,764,890 B1 | 7/2004 | Xu |
| 6,784,060 B2 | 8/2004 | Ryoo |
| 6,784,490 B1 | 8/2004 | Inoue et al. |
| 6,819,184 B2 | 11/2004 | Pengelly et al. |
| 6,822,296 B2 | 11/2004 | Wang |
| 6,825,531 B1 | 11/2004 | Mallikarjunaswamy |
| 6,846,729 B2 | 1/2005 | Andoh et al. |
| 6,855,581 B2 | 2/2005 | Roh et al. |
| 6,869,848 B2 | 3/2005 | Kwak |
| 6,894,349 B2 | 5/2005 | Beasom |
| 6,958,515 B2 | 10/2005 | Hower et al. |
| 7,015,116 B1 | 3/2006 | Lo et al. |
| 7,023,050 B2 | 4/2006 | Salama et al. |
| 7,037,788 B2 | 5/2006 | Ito et al. |
| 7,075,575 B2 | 7/2006 | Hynecek |
| 7,091,079 B2 | 8/2006 | Chen et al. |
| 7,148,540 B2 | 12/2006 | Shibib et al. |
| 7,214,591 B2 | 5/2007 | Hsu |
| 7,309,636 B2 | 12/2007 | Chen |
| 7,323,740 B2 | 1/2008 | Park et al. |
| 7,358,567 B2 | 4/2008 | Hsu |
| 7,427,552 B2 | 9/2008 | Jin et al. |
| 8,357,986 B2 * | 1/2013 | Wang et al. .................. 257/492 |
| 2003/0022460 A1 | 1/2003 | Park |
| 2004/0018698 A1 | 1/2004 | Schmidt |
| 2004/0070050 A1 | 4/2004 | Chi |
| 2005/0227448 A1 | 10/2005 | Chen et al. |
| 2005/0258496 A1 | 11/2005 | Tsuchiko |
| 2006/0035437 A1 | 2/2006 | Mitsuhira et al. |
| 2006/0261407 A1 | 11/2006 | Blanchard et al. |
| 2006/0270134 A1 | 11/2006 | Lee et al. |
| 2006/0270171 A1 | 11/2006 | Chen et al. |
| 2007/0041227 A1 | 2/2007 | Hall et al. |
| 2007/0082440 A1 | 4/2007 | Shiratake |
| 2007/0132033 A1 | 6/2007 | Wu et al. |
| 2007/0273001 A1 | 11/2007 | Chen et al. |
| 2008/0160697 A1 | 7/2008 | Kao |
| 2008/0160706 A1 | 7/2008 | Jung |
| 2008/0185629 A1 | 8/2008 | Nakano et al. |
| 2008/0296655 A1 | 12/2008 | Lin et al. |
| 2009/0108348 A1 | 4/2009 | Yang et al. |
| 2009/0111252 A1 | 4/2009 | Huang et al. |
| 2009/0159966 A1 | 6/2009 | Huang |
| 2009/0256212 A1 * | 10/2009 | Denison et al. .................. 257/408 |
| 2009/0278208 A1 | 11/2009 | Chang |
| 2009/0294865 A1 | 12/2009 | Tang et al. |
| 2010/0006937 A1 | 1/2010 | Lee |
| 2010/0032758 A1 | 2/2010 | Wang et al. |
| 2010/0096702 A1 | 4/2010 | Chen et al. |
| 2010/0148250 A1 | 6/2010 | Lin et al. |
| 2010/0213517 A1 | 8/2010 | Sonsky et al. |
| 2011/0057263 A1 | 3/2011 | Tang et al. |

* cited by examiner

US 8,729,631 B2

MOS TRANSISTOR

BACKGROUND OF THE INVENTION

1. Field of Invention

This invention relates to a semiconductor device, and more particularly relates to a metal-oxide-semiconductor (MOS) transistor.

2. Description of Related Art

It is important in the semiconductor technology to reduce feature sizes, improve the speed and the cost per integrated circuit unit, and so on. With the development of semiconductor technology, high-power devices have been applied to various electronic products in different fields. The laterally diffused MOS (LDMOS) or extended-drain MOS (EDMOS) transistor is widely used in high-voltage or high-power PMIC (power management integrated circuit) application as the driving device.

In consideration of power consumption, the On-resistance (Ron) is an important characteristic for PMIC products, especially for portable IC devices. The Ron can be effectively decreased by modifying the structure of the LDMOS or EDMOS device, e.g., changing the shape of the isolation (e.g., STI) or a doping well, but Ron improvement is still limited on current LDMOS or EDMOS devices. Also, increasing the breakdown voltage (BVD) is important for performance of LDMOS or EDMOS devices.

SUMMARY OF THE INVENTION

Accordingly, this invention provides a MOS transistor that has a lower Ron and a higher BVD than the conventional device and therefore has an even lower Ron/BVD ratio than the same. The MOS transistor may be a LDMOS or EDMOS transistor.

The MOS transistor includes: source and drain regions in a substrate, an isolation between the source and drain regions, a first gate conductor between the source region and the isolation, at least one conductive plug electrically connected to the first gate conductor and penetrating into the isolation, and at least one second gate conductor on the isolation, which is electrically connected to the first gate conductor and the at least one conductive plug. One of the at least one conductive plug is located between the first gate conductor and the at least one second gate conductor.

There may be different combinations for the at least one conductive plug and the at least one second gate conductor. Exemplary combinations are: a single conductive plug and a single second gate conductor, a single conductive plug and two second gate conductors, a single second gate conductor and two conductive plugs sandwiching the single second gate conductor, two conductive plugs and two second gate conductors that are arranged alternately, and a pair of second gate conductors and three conductive plugs with two between the first gate conductor and the pair of second gate conductors and one between the pair of second gate conductors.

In the MOS transistor of this invention, the plug electrically connected to the gate conductor and penetrating in the isolation can accumulate electrons in the substrate at the sidewall and the corner of the isolation, so the Ron can be effectively decreased. Meanwhile, the second gate conductor(s) on the isolation can reduce the electric field between the conductive plug and the 104/102 PN junction, so the BVD can be effectively increased. As a result, an even lower Ron/BVD ratio can be obtained.

In order to make the aforementioned and other objects, features and advantages of the present invention comprehensible, a preferred embodiment accompanied with figures is described in detail below.

BRIEF DESCRIPTION OF THE DRAWINGS

FIGS. 6A-6E illustrate half cross-sectional views of five other MOS transistors that were compared with the MOS transistors of the first to fourth embodiments of this invention by computer simulation, wherein FIGS. 6A and 6C show two conventional MOS transistors, FIGS. 6B and 6E show two MOS transistors having a penetrating conductive plug far away from the source-side border of the isolation and having no second gate conductor, and FIG. 6D shows a MOS transistor having a penetrating plug near the source-side border of the isolation but no second gate conductor.

DESCRIPTION OF EMBODIMENTS

It is noted that the following embodiments are intended to further explain this invention but not to limit the scope thereof. For example, though the device shown in the figures is a LDMOS device, this invention can also be applied to EDMOS devices.

Figure 1:
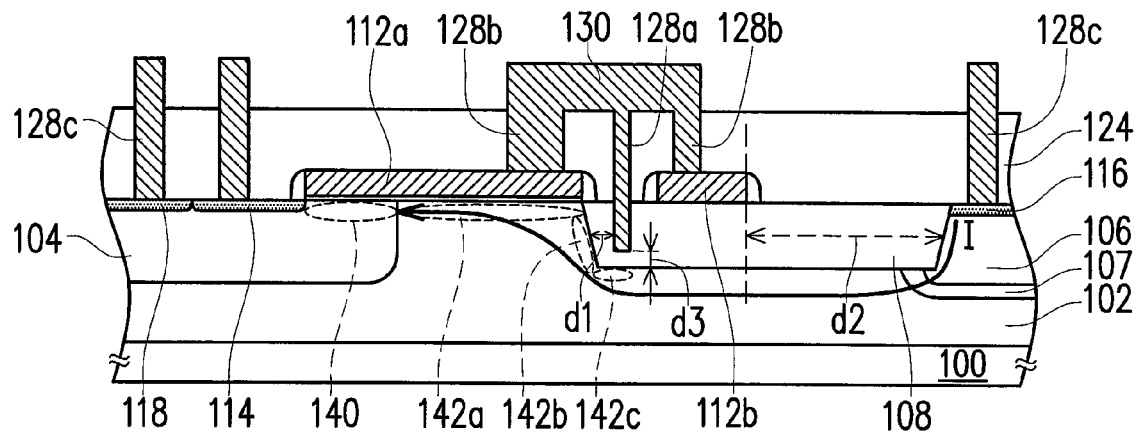
FIG. 1 illustrates a half cross-sectional view of a MOS transistor according to a first embodiment of this invention.

FIG. 1 illustrates a half cross-sectional view of a MOS transistor according to the first embodiment of this invention. The LDMOS transistor includes a substrate 100 of a first conductivity type (such as P-type), a deep well 102 of a second conductivity type (such as N-type) formed in the substrate 100 and extending down from the surface of the substrate 100, a first well 104 of the first conductivity type (such as P-type) and a second well 106 of the second conductivity type (such as N-type) that are spaced apart from each other and both formed in the deep well 102 by extending down from the surface of the substrate 100, an isolation 108 extending down from the surface of the substrate 100 and disposed between the first well 104 and the second well 106, a first gate conductor 112a partially over the first well 104 and partially over the substrate 100 between the first well 104 and the isolation 108, a source region 114 of the second conductivity type (such as N-type) in the first well 104 beside the first gate conductor 112a, a drain region 116 of the second conductivity type (such as N-type) in the second well 106 beside the isolation 108, and a pickup doped region 118 of the first well 104 beside the source region 114.

The isolation 108 may be a shallow trench isolation (STI) or a field oxide (FOX) isolation. The LDMOS device might also include a HV (High Voltage) field 107 with the second conductivity type, such as a HVN (High Voltage N-type) field as the second conductivity type is N-type, around the second well 106. The drain region 116, the second well 106, the HV field 107 and the deep well 102 are implanted in an order from high to low concentrations. A channel region 140 is in the first well 104 under the first gate conductor 112a. The electrical conduction path between the channel region 140 and the drain 116 is indicated by the arrow line I, which passes under the isolation 108.

Referring to FIG. 1 again, the LDMOS device also includes a conductive plug 128a electrically connected to the first gate conductor 112a and penetrating into the isolation 108, and a second gate conductor 112b that is disposed on the isolation 108 and electrically connected to the first gate conductor 112a and the conductive plug 128a. The conductive plug 128a is electrically connected to the first gate conductor 112a and the second gate conductor 112b by an upper conductive layer 130 electrically connected with the conductive plug 128a, and shorter conductive plugs 128b disposed on the first gate conductor 112a and the second gate conductor 112b, respectively, and electrically connected to the upper conductive layer 130. In addition, more conductive plugs 128c are disposed on the source region 114, the drain region 116 and the pickup doped region 118, respectively, for their electrical connection.

In operation of the LDMOS, some electrons accumulate in the region 142a of the deep well 102 under the first gate conductor 112a. And, to effectively accumulate electrons in the regions 142b and 142c of the substrate 100 respectively at the sidewall and the corner of the isolation 108 to effectively decrease the Ron, the distance d1 between the conductive plug 128a and the source-side border of the isolation 108 may range from 0.13 µm to 0.55 µm, and the distance d3 between the bottom of the conductive plug 128a and the bottom of the isolation 108 may range from 0.1 µm to 0.3 µm. On the other hand, to effectively reduce the electric field between the isolation left sideward to 104/102 PN junction and thereby effectively increase the BVD, the distance d2 between the second gate conductor 112b and the drain-side border of the isolation 108 may range from 0 to 1.4 µm.

The first gate conductor 112a and the second gate conductor 112b may include metal, doped polysilicon, or a combination thereof. The conductive plugs 128a, 128b and 128c may include tungsten (W), copper (Cu) or any other suitable conductive material. In addition, it is possible to form the conductive plug 128a, the conductive plugs 128b and the upper conductive layer 130 in an integral, as shown in FIG. 1. Alternatively, the conductive plugs 128a, 128b and 128c may include a material different from that of the upper conductive layer 130. For example, it is possible that the conductive plugs 128a, 128b and 128c include tungsten and the upper conductive layer 130 includes Al, Cu or any other suitable conductive material.

Figure 2:
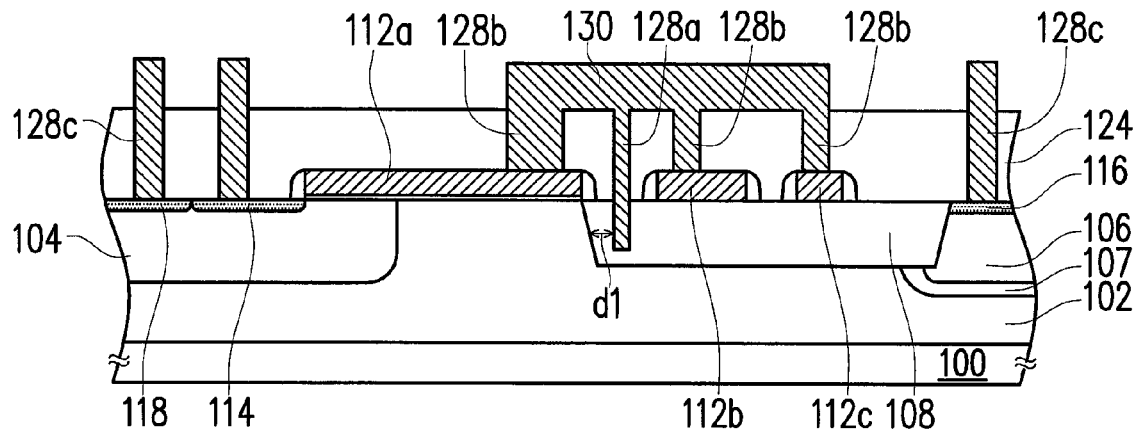
FIG. 2 illustrates a half cross-sectional view of a MOS transistor according to a second embodiment of this invention.

FIG. 2 illustrates a half cross-sectional view of a MOS transistor according to the second embodiment of this invention.

The MOS transistor of the second embodiment is different from that of the first embodiment in that one more second gate conductor 112c electrically connected to the first gate conductor 112a is disposed on the isolation 108, between the second gate conductor 112b and the drain region 116. The second gate conductor 112c includes the same material of the gate conductors 112a and 112b, and is electrically connected to the first gate conductor 112a also via a shorter conductive plug 128b, the upper conductive layer 130 and the conductive plug 128b on the first gate conductor 112a.

Figure 3:
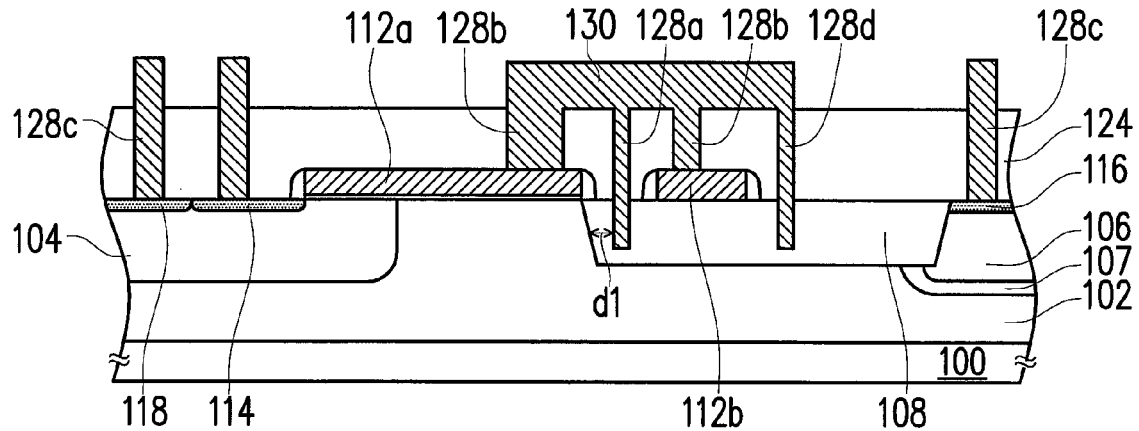
FIG. 3 illustrates a half cross-sectional view of a MOS transistor according to a third embodiment of this invention.

FIG. 3 illustrates a half cross-sectional view of a MOS transistor according to the third embodiment of this invention.

The MOS transistor of the third embodiment is different from that of the first embodiment in that one more conductive plug 128d electrically connected to the first gate conductor 112a and penetrating into the isolation 108 is disposed, between the second gate conductor 112b and the drain region 116. The conductive plug 128d is electrically connected with the first gate conductor 112a also via the upper conductive layer 130 and the conductive pug 128b on the first gate conductor 112a.

Figure 4:
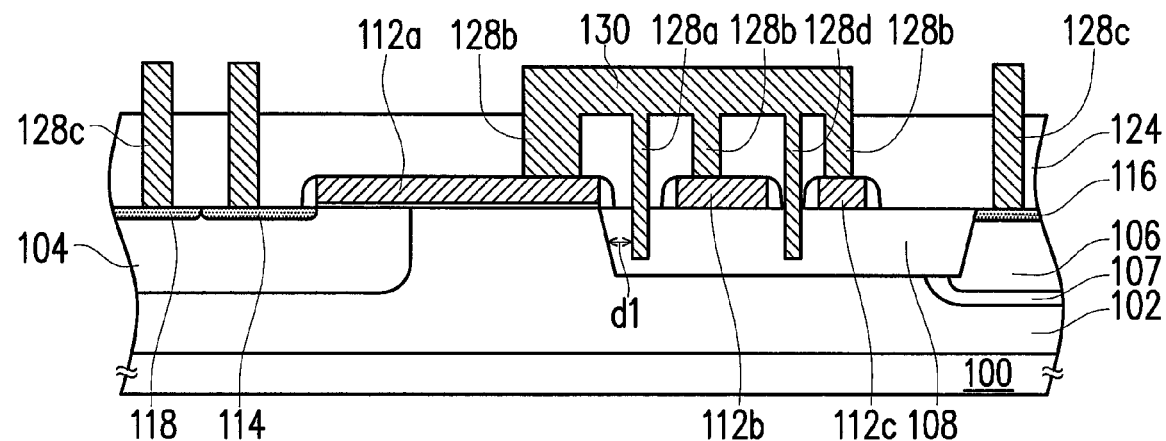
FIG. 4 illustrates a half cross-sectional view of a MOS transistor according to a fourth embodiment of this invention.

FIG. 4 illustrates a half cross-sectional view of a MOS transistor according to the fourth embodiment of this invention.

The MOS transistor of the fourth embodiment is different from that of the second embodiment (FIG. 2) in that one more conductive plug 128d electrically connected to the first gate conductor 112a and penetrating into the isolation 108 is disposed, between the two second gate conductors 112b and 112c on the isolation 108. The conductive plug 128d is electrically connected to the first gate conductor 112a as in the case of the third embodiment (FIG. 3) of this invention.

Figure 5:
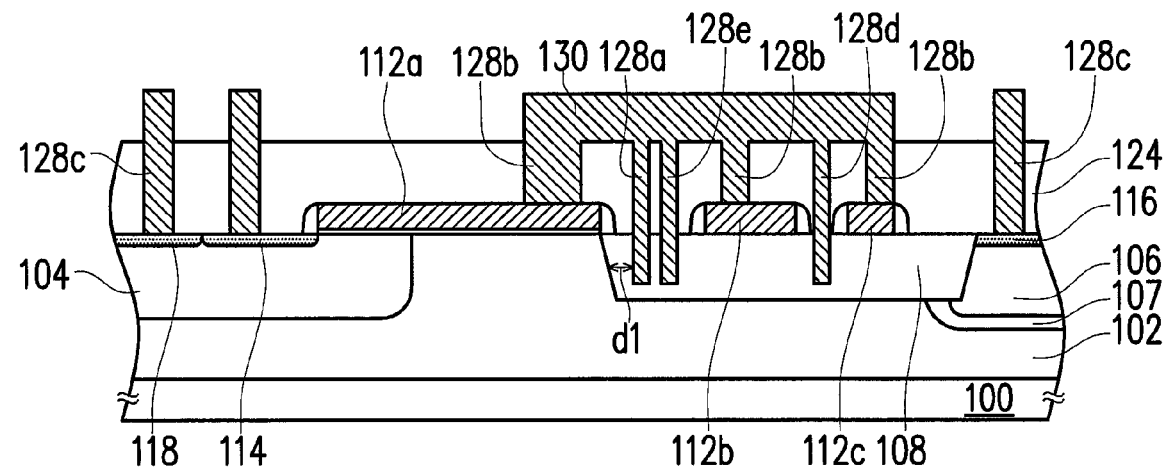
FIG. 5 illustrates a half cross-sectional view of a MOS transistor according to a fifth embodiment of this invention.

FIG. 5 illustrates a half cross-sectional view of a MOS transistor according to the fifth embodiment of this invention.

The MOS transistor of the fifth embodiment is different from that of the fourth embodiment (FIG. 4) in that one more conductive plug 128e electrically connected to the first gate conductor 112a and penetrating into the isolation 108 is disposed between the first gate conductor 112a and the pair of second gate conductors 112b and 112c disposed on the isolation 108. The conductive plug 128e is between the conductive plug 128a and the second gate conductor 112b, and is electrically connected to the first gate conductor 112a as in the case of the conductive plug 128a described in the first embodiment (FIG. 1) of this invention.

To prove the effect of decreasing Ron, increasing BVD and decreasing Ron/BVD ratio of the MOS transistor of this invention, the above MOS transistor structures are compared with some other MOS transistor structures for their Ron and BVD values, by computer simulations.

Figure 6A:
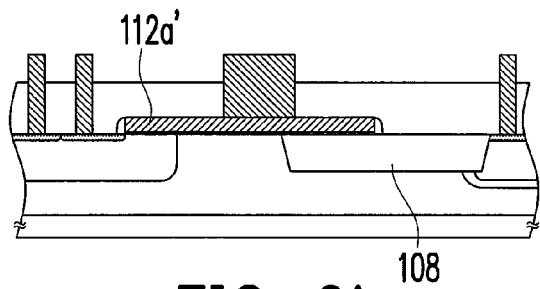
Figure 6B:
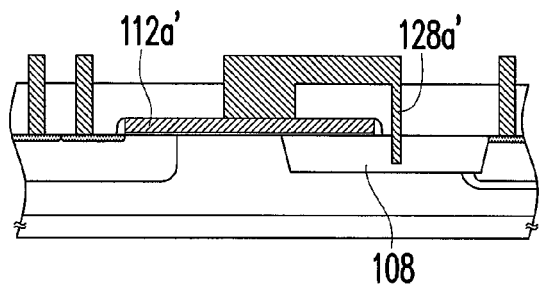
Figure 6C:
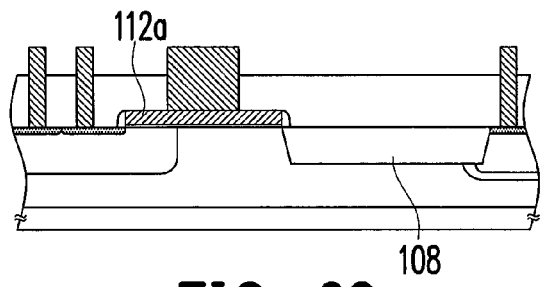
Figure 6D:
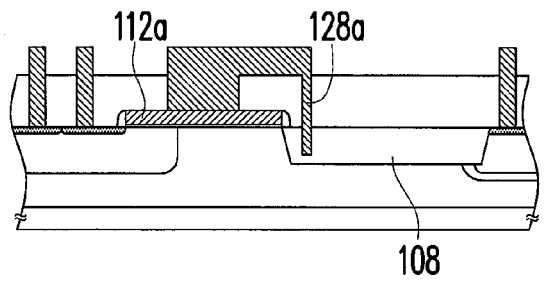
Figure 6E:
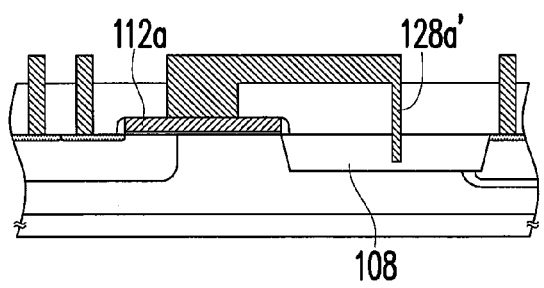

FIGS. 6A-6E illustrate half cross-sectional views of five other MOS transistors that were compared with the MOS transistors of the first to fourth embodiments of this invention, wherein FIGS. 6A and 6C show two conventional MOS transistors, FIGS. 6B and 6E show two MOS transistors having a penetrating conductive plug (128a') far away from the source-side border of the isolation and having no second gate conductor, and FIG. 6D shows a MOS transistor having a penetrating conductive plug (128a) near the source-side border of the isolation but no second gate conductor. It is noted that the first gate conductors 112a' of the MOS transistors illustrated in FIGS. 6A and 6B have a greater width than the first gate conductors 112a of the MOS transistors in the other figures of this application.

The result of the first part of the simulation is provided in Table 1 below. It is noted that the distance d3, which is the distance from the bottom of the penetrating conductive plug 128a, 128d or 128a' to that of the isolation 108, is fixed at 0.1 µm.

TABLE 1

| | Structure | d1 (μm) | BVD (V) | Ron (mΩ/mm²) | Ron/BVD | Ron/BVD improvement |
|---|---|---|---|---|---|---|
| CEx.[a] 1 | FIG. 6A | — | 46 | 56.84 | 1.24 | — (as a standard) |
| CEx. 2 | FIG. 6B | 1.55 | 49 | 56.50 | 1.15 | 7% |
| CEx. 3 | FIG. 6C | — | 38 | 59.27 | 1.56 | −26% |
| CEx. 4 | FIG. 6D | 0.21 | 48 | 53.53 | 1.12 | 10% |
| CEx. 5 | FIG. 6E | 1.51 | 42 | 58.08 | 1.38 | −12% |
| Example 1 | FIG. 1 | 0.21 | 54 | 52.75 | 0.98 | 21% |
| Example 2 | FIG. 2 | 0.21 | 55 | 52.58 | 0.96 | 23% |
| Example 3 | FIG. 3 | 0.21 | 59 | 52.36 | 0.89 | 28% |
| Example 4 | FIG. 4 | 0.21 | 59 | 52.26 | 0.89 | 28% |
| Example 5 | FIG. 5 | 0.21 | 58 | 51.66 | 0.89 | 28% |

[a]CEx. = Comparative Example.

Referring to Table 1, by comparing the results of Comparative Examples 4 and 1, it is clear that a penetrating conductive plug (128a, FIG. 6D) near the source-side border of the isolation (108) can effectively reduce Ron only but cannot effectively increase BVD. Differently, as indicated by the results of Comparative Examples 1 and 4 and Examples 1-5, by further including at least one second gate conductor on the isolation in addition to the penetrating conductive plug as in this invention, not only Ron can be effectively reduced, but also BVD can be effectively increased. As a result, the Ron/BVD ratio can be further decreased.

The second part of the computer simulation was for investigating the effect of the distance d2 (between the second gate conductor and the drain-side border of the isolation) to Ron, BVD and the Ron/BVD ratio, wherein the MOS transistor of the first embodiment (FIG. 1) is taken as an example. The results are provided in Table 2.

TABLE 2

| | d2 (μm) | BVD (V) | Ron (mΩ/mm²) | Ron/BVD | Ron/BVD improvement |
|---|---|---|---|---|---|
| Example 6 | 1.4 | 54 | 52.75 | 0.98 | 21% |
| Example 7 | 1.0 | 55 | 52.63 | 0.96 | 23% |
| Example 8 | 0.6 | 55 | 52.56 | 0.96 | 23% |
| Example 9 | 0.2 | 55 | 52.53 | 0.96 | 23% |
| Example 10 | 0.1 | 55 | 52.53 | 0.96 | 23% |
| Example 11 | 0 | 55 | 52.53 | 0.96 | 23% |

It is clear from Table 2 that the Ron, the BVD or the Ron/BVD ratio is close to a constant value when the distance d2 is below a certain value. Nevertheless, the Ron, BVD or Ron/BVD ratio at any of the above d2 values is much improved as compared to the conventional LDMOS transistor structures.

As demonstrated by the above simulation results, in the MOS transistor of this invention, the conductive plug electrically connected to the first gate conductor and penetrating into the isolation can effectively decrease the Ron, and the second gate conductor(s) on the isolation can effectively increase the BVD, so that an even lower Ron/BVD ratio can be obtained, as compared to the conventional LDMOS transistors.

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:

1. A metal-oxide-semiconductor (MOS) transistor, comprising:
   a source region and a drain region in a semiconductor substrate;
   an isolation between the source region and the drain region;
   a first gate conductor between the source region and the isolation;
   at least one first conductive plug, electrically connected to the first gate conductor and penetrating into the isolation; and
   at least one second gate conductor comprising a pair of gate conductors on the isolation, being electrically connected to the first gate conductor and the at least one first conductive plug, wherein
   the at least one first conductive plug comprises a single conductive plug between the first gate conductor and the pair of gate conductors.

2. A metal-oxide-semiconductor (MOS) transistor, comprising:
   a source region and a drain region in a semiconductor substrate;
   an isolation between the source region and the drain region;
   a first gate conductor between the source region and the isolation;
   at least one first conductive plug, electrically connected to the first gate conductor and penetrating into the isolation;
   at least one second gate conductor comprising a single gate conductor on the isolation, being electrically connected to the first gate conductor and the at least one first conductive plug,
   wherein one of the at least one first conductive plug is located between the first gate conductor and the at least one second gate conductor; and
   the at least one first conductive plug comprises two conductive plugs sandwiching the single gate conductor.

3. A metal-oxide-semiconductor (MOS) transistor, comprising:
   a source region and a drain region in a semiconductor substrate;
   an isolation between the source region and the drain region;
   a first gate conductor between the source region and the isolation;
   at least one first conductive plug, electrically connected to the first gate conductor and penetrating into the isolation; and
   at least one second gate conductor on the isolation, being electrically connected to the first gate conductor and the at least one first conductive plug, wherein
   one of the at least one first conductive plug is located between the first gate conductor and the at least one second gate conductor,
   the at least one second gate conductor comprises a pair of gate conductors, and
   the at least one first conductive plug comprises: a first plug between the first gate conductor and the pair of gate conductors, and a second plug between the pair of gate conductors.

4. The MOS transistor of claim 3, wherein
   the at least one first conductive plug further comprises: a third plug between the first gate conductor and the pair of gate conductors.

5. The MOS transistor of claim 1, further comprising:
   a channel region in the substrate under the first gate conductor.

6. The MOS transistor of claim 5, further comprising:
an electrical conduction path between the channel region and the drain region and passing under the isolation.

7. The MOS transistor of claim 6, wherein the substrate has a first conductivity type, and the source region and the drain region have a second conductivity type, the MOS transistor further comprising:
a deep well of the second conductivity type in the substrate;
a first well of the first conductivity type in the deep well and partially under the first gate conductor, wherein the source region and the channel region are located in the first well; and
a second well of the second conductivity type in the deep well, having a dopant concentration higher than a dopant concentration of the deep well, wherein the drain region is located in the second well.

8. The MOS transistor of claim 7, further comprising: a HV (high voltage) field of the second conductivity type between the deep well and the second well, wherein the HV field has a dopant concentration higher than the dopant concentration of the deep well but lower than the dopant concentration of the second well.

9. The MOS transistor of claim 1, wherein the isolation comprises a shallow trench isolation (STI).

10. The MOS transistor of claim 1, wherein the isolation comprises a field oxide (FOX) isolation.

11. The MOS transistor of claim 1, wherein a distance between the at least one second gate conductor and a drain-side border of the isolation ranges from 0 to 1.4 μm.

12. The MOS transistor of claim 1, wherein a distance between the one first conductive plug and a source-side border of the isolation ranges from 0.13 μm to 0.55 μm.

13. The MOS transistor of claim 1, wherein a distance between a bottom of the at least one first conductive plug and a bottom of the isolation ranges from 0.1 μm to 0.3 μm.

14. The MOS transistor of claim 1, wherein the at least one first conductive plug is electrically connected with the first and the second gate conductors via
an upper conductive layer electrically connected with the at least one first conductive plug, and
a plurality of second conductive plugs disposed over the first gate conductor and the at least one second gate conductor, respectively, and electrically connected with the upper conductive layer.

15. The MOS transistor of claim 14, wherein the at least one first conductive plug, the second conductive plugs and the upper conductive layer are formed in an integral.

16. The MOS transistor of claim 14, wherein the first and the second conductive plugs comprise a material different from a material of the upper conductive layer.

17. The MOS transistor of claim 1, wherein the first gate conductor and the at least one second gate conductor comprises metal, doped polysilicon or a combination thereof.

18. The MOS transistor of claim 1, which is a laterally diffused MOS (LDMOS) transistor or an extended-drain MOS (EDMOS).

* * * * *